US008653459B2

(12) United States Patent
Kanno et al.

(10) Patent No.: US 8,653,459 B2
(45) Date of Patent: Feb. 18, 2014

(54) SCANNING ELECTRON MICROSCOPE

(75) Inventors: Seiichiro Kanno, Iwaki (JP); Hiroyuki Kitsunai, Kasumigaura (JP); Masaru Matsushima, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 43 days.

(21) Appl. No.: 13/518,236

(22) PCT Filed: Dec. 24, 2010

(86) PCT No.: PCT/JP2010/073315
§ 371 (c)(1),
(2), (4) Date: Jun. 21, 2012

(87) PCT Pub. No.: WO2011/081087
PCT Pub. Date: Jul. 7, 2011

(65) Prior Publication Data
US 2012/0256087 A1    Oct. 11, 2012

(30) Foreign Application Priority Data
Dec. 28, 2009  (JP) .................................. 2009-297104

(51) Int. Cl.
*H01J 37/20* (2006.01)
(52) U.S. Cl.
USPC ........................................ 250/311; 250/310
(58) Field of Classification Search
USPC ............. 250/306, 307, 309–311, 492.3, 526;
361/234, 233, 437
See application file for complete search history.

(56) References Cited

U.S. PATENT DOCUMENTS

| 5,872,694 | A | 2/1999 | Hoinkis et al. |
| 6,303,451 | B1 * | 10/2001 | Zhang et al. ................... 438/301 |
| 6,753,129 | B2 * | 6/2004 | Livesay et al. ................. 430/296 |

(Continued)

FOREIGN PATENT DOCUMENTS

| JP | 6-45214 A | 2/1994 |
| JP | 11-251420 A | 9/1999 |

(Continued)

OTHER PUBLICATIONS

International Search Report including English language translation dated Feb. 8, 2011 (Three (3) pages).

(Continued)

*Primary Examiner* — Bernard E Souw
(74) *Attorney, Agent, or Firm* — Crowell & Moring LLP

(57) ABSTRACT

There is provided a technique that is capable of attracting a sample without making the voltage applied to an electrostatic chuck unnecessarily large. Attraction experiments with respect to the electrostatic chuck are performed using a testing sample whose degree of warp and pattern of warp are known, and a critical application voltage at which the attraction state changes from "bad" to "good" is found. When measuring an inspection target sample, the flatness of the inspection target sample is measured, and the degree of warp and pattern of warp of the inspection target sample are detected. Based on the degree of warp and pattern of warp of the inspection target sample and on the known critical application voltage, the application voltage for the electrostatic chuck is set.

20 Claims, 11 Drawing Sheets

(56) References Cited

U.S. PATENT DOCUMENTS

| | | | |
|---|---|---|---|
| 7,186,658 B2* | 3/2007 | Huang et al. | 438/706 |
| 8,232,522 B2* | 7/2012 | Miya et al. | 250/306 |
| 8,497,476 B2* | 7/2013 | Hatakeyama et al. | 250/310 |
| 8,519,332 B2* | 8/2013 | Miya et al. | 250/306 |
| 2003/0108818 A1* | 6/2003 | Livesay et al. | 430/296 |
| 2005/0014031 A1* | 1/2005 | Hiramatsu et al. | 428/698 |
| 2011/0095185 A1* | 4/2011 | Miya et al. | 250/311 |
| 2012/0070066 A1* | 3/2012 | Kitsunai et al. | 382/145 |
| 2012/0074316 A1* | 3/2012 | Watanabe et al. | 250/307 |
| 2012/0235036 A1* | 9/2012 | Hatakeyama et al. | 250/310 |
| 2012/0261589 A1* | 10/2012 | Miya et al. | 250/442.11 |

FOREIGN PATENT DOCUMENTS

| | | |
|---|---|---|
| JP | 2000-31252 A | 1/2000 |
| JP | 2005-72521 A | 3/2005 |
| JP | 2005-116849 A | 4/2005 |
| JP | 2007-165917 A | 6/2007 |

OTHER PUBLICATIONS

Japanese Notice of Rejection dated Jan. 8, 2013 (three (3) pages).

* cited by examiner

| Voltage (±V) | No warp | Concave warp | Convex warp |
|---|---|---|---|
| 100 | ○ | × | × |
| 200 | ○ | × | × |
| 300 | ○ | × | × |
| 400 | ○ | × | × |
| 500 | ○ | × | × |
| 600 | ○ | × | × |
| 700 | ○ | × | × |
| 800 | ○ | × | × |
| 900 | ○ | × | × |
| 1000 | ○ | ○ | × |
| 1100 | ○ | ○ | ○ |
| 1200 | ○ | ○ | ○ |

SCANNING ELECTRON MICROSCOPE

TECHNICAL FIELD

The present invention relates to a scanning electron microscope, and, more particularly, to a scanning electron microscope whose sample stage is provided with an electrostatic chuck.

BACKGROUND ART

In recent years, scanning electron microscopes (SEMs) have been employed to measure the size of or to inspect for defects in semiconductor device patterns. By way of example, critical dimension SEMs (hereinafter CD-SEMs) are used to measure the gate size of semiconductor devices, and defect inspection SEMs are used for defect inspection. In addition, scanning electron microscopes are beginning to be used for inspecting the continuity of deep holes for wiring using potential contrast.

Since CD-SEMs are used to measure the size of device patterns in semiconductor fabrication lines, improvements in not only their performance as electron microscopes, e.g., resolution, critical dimension reproducibility, etc., but also in throughput are extremely important. Although there are several factors that determine throughput, of particular importance are the movement speed of the sample stage on which a wafer is placed, and the time it takes for auto-focus when obtaining an image. In order to improve these two aspects, an electrostatic chuck is used as a means for securing a wafer to the sample stage.

Electrostatic chucks are advantageous in that they are capable of securing wafers stably. Thus, wafers are prevented from falling off the sample stage, and it becomes possible to transport wafers at high accelerations, and high speeds. In addition, since electrostatic chucks attract the entire surface of a wafer with a substantially even force, it is possible to flatten wafers even if they are warped. Accordingly, the time it takes to determine the value of the current to be passed through the coil of the objective lens for focusing, that is, the auto-focus time, may be shortened.

PRIOR ART DOCUMENTS

Patent Documents

Patent Document 1: JP Patent Application Publication (Kokai) No. 2007-165917 A

SUMMARY OF THE INVENTION

Problems to be Solved by the Invention

Even though wafers are, ideally, flat disk-like members, in reality, they, albeit slightly, are warped or have concavity/convexity. In recent years, there has been a trend for semiconductor wafers to become larger in diameter. Consequently, there has been a trend for warping or the concavity/convexity to become greater as well. In order to ensure the flattening of wafers by electrostatic chucks, there has conventionally been a tendency to set the voltage to be applied to the electrostatic chuck to a relatively large value. In other words, regardless of the type or degree of warping or concavity/convexity in the wafer, a predetermined and relatively large voltage is applied to the electrostatic chuck.

When the voltage applied to the electrostatic chuck made to be large, residual charge occurs at the interface between the electrostatic chuck and the wafer. The occurrence of residual charge gives rise to various problems. Patent Document 1 discloses an example of a method of cancelling out residual charge. In order to prevent the occurrence of residual charge, it is necessary to avoid making the voltage to be applied to the electrostatic chuck unnecessarily large.

An object of the present invention is to provide a technique capable of attracting a sample without making the voltage applied to the electrostatic chuck unnecessarily large.

Means for Solving the Problems

According to the present invention, an attraction experiment with respect to an electrostatic chuck is performed using a testing sample whose degree of warp and pattern of warp are known to find the critical application voltage at which the attraction state changes from "bad" to "good."

When measuring an inspection target sample, the flatness of the inspection target sample is measured, and the degree of warp and pattern of warp of the inspection target sample are detected. Based on the degree of warp and pattern of warp of the inspection target sample, and on a known critical application voltage, the application voltage for the electrostatic chuck is set.

Effects of the Invention

According to the present invention, it is possible to attract a wafer without making the voltage applied to the electrostatic chuck be unnecessarily large.

MODES FOR CARRYING OUT THE INVENTION

Figure 1:
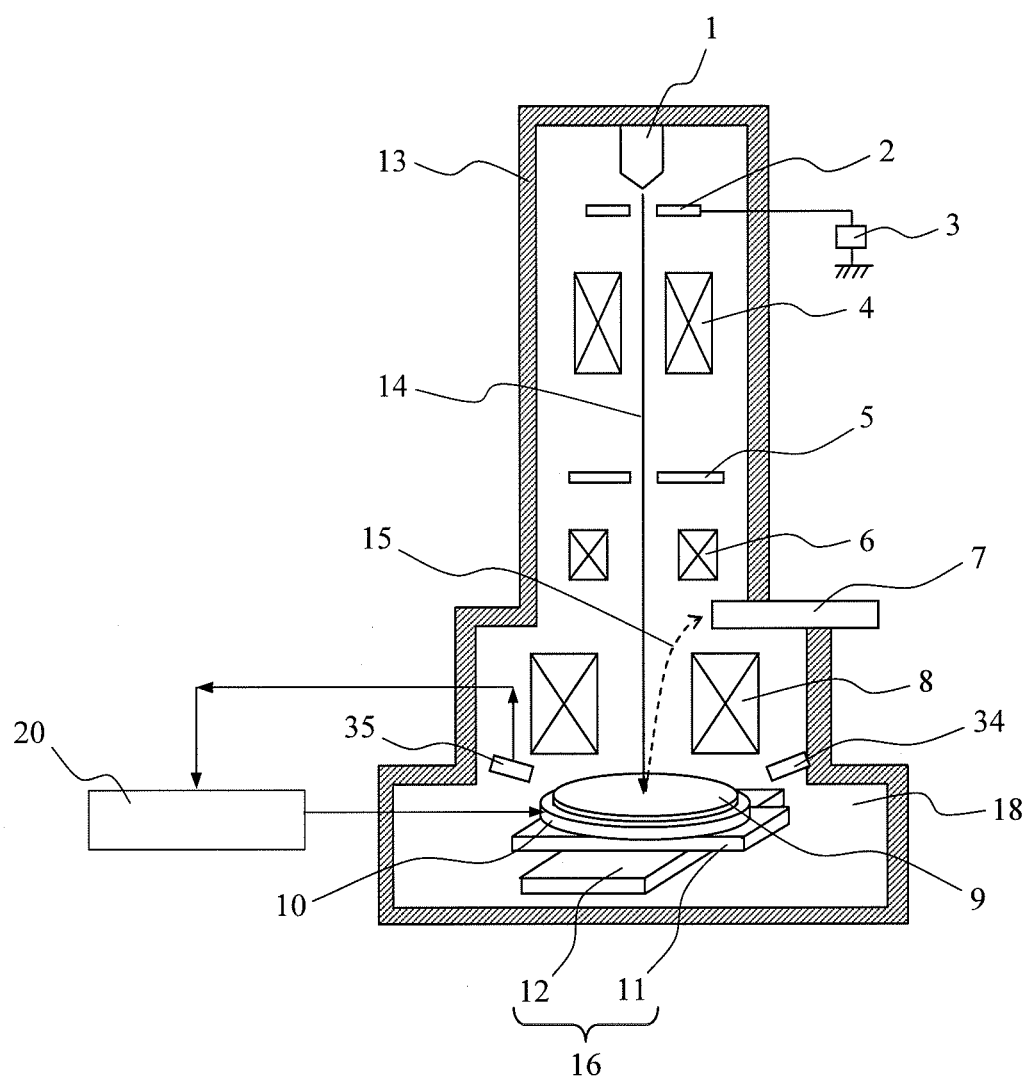
FIG. 1 is a diagram showing a schematic configuration of the first example of a scanning electron microscope of the present invention.

The structure of a scanning electron microscope of the present invention is described with reference to FIG. 1. Here, as an example of a scanning electron microscope, a critical dimension scanning electron microscope (CD-SEM) is described. However, the present invention is by no means limited to CD-SEMs. A scanning electron microscope of the present example comprises an electron source 1, a primary electron accelerating electrode 2, an electron lens 4 for focusing, an aperture 5, a scanning coil 6, a secondary electron detector 7, an objective lens 8, and an X-Y stage 16. These are disposed inside a housing 13 that is maintained under high vacuum. The scanning electron microscope of the present example further comprises attraction state measuring devices 34 and 35, and a control device 20. The X-Y stage 16 is disposed in a processing chamber 18 of the housing 13 and comprises an X stage 12, a Y stage 11 disposed above the X stage 12, and an electrostatic chuck 10 disposed above the Y stage 11. Several types of electrostatic chucks are known, such as Coulomb electrostatic chucks, Johnsen-Rahbek electrostatic chucks, etc. While the electrostatic chuck may be of any type according to the present invention, it is assumed to be a Coulomb electrostatic chuck in the description below.

A semiconductor wafer (hereinafter simply "wafer") 9 is mounted on the electrostatic chuck 10 as a sample. Although a description is provided here with respect to a case where the wafer 9 is the sample, the sample is by no means limited to wafers.

The wafer 9 may be moved freely in both the X-direction and the Y-direction. Thus, any given position on the wafer may be measured. In addition, three unillustrated through-holes are formed in the electrostatic chuck 10, and the configuration is such that lift pins are able to move within these three through-holes in the up/down direction. When mounting or demounting a wafer on or from the electrostatic chuck, the lift pins move in the up/down direction.

An electron beam 14 emitted from the electron source 1 is accelerated at the primary electron accelerating electrode 2 to which a high voltage is applied by a high-voltage power source 3. The electron beam 14 is focused by the electron lens 4 for focusing. The beam current amount of the electron beam 14 is adjusted by the aperture 5. The electron beam 14 is scanned two-dimensionally by the scanning coil 6. The electron beam is focused by the objective lens 8 disposed directly above the wafer 9, and hits the wafer 9. Secondary electrons 15 are generated from the wafer 9. The secondary electrons 15 are detected by the secondary electron detector 7. The amount of secondary electrons detected reflects the shape of the sample surface. By synchronizing the scanning of the electron beam with secondary electron detection and displaying it on a monitor, fine patterns on the sample may be imaged. With CD-SEMs, when, for example, measuring the line width of a gate electrode, the edges of the pattern are determined based on how the obtained image varies in brightness/darkness, thereby deriving measurements.

It is noted that although the present drawing has been depicted as a sectional view of the housing and its internal structure as viewed from the side, the X-Y stage, the electrostatic chuck and the wafer have been depicted in perspective to make it easier to visualize their operations.

The attraction state measuring devices 34 and 35 measure the attraction state of the wafer 9 mounted on the electrostatic chuck 10. The attraction state measured by the attraction state measuring devices 34 and 35 is sent to the control device 20. The control device 20 sets the DC voltage to be applied to the electrostatic chuck 10 based on the attraction state, the details of which will be discussed later.

The term attraction state as used herein refers to the flatness of the wafer 9 that is attracted by the electrostatic chuck 10. Accordingly, so long as they are capable of measuring the flatness of the sample, the attraction state measuring devices 34 and 35 may be of any structure, and may be an optical height-measuring instrument comprising a light emitter 34 and a light receiver 35, or a Z-sensor, for example. As a height measuring device, not only an optical height measuring instrument, but also a capacitive displacement sensor may be used. In addition, the flatness of a wafer may also be measured using an image taken by an optical microscope attached to the scanning electron microscope or by the scanning electron microscope itself. By way of example, by quantifying the sharpness of an image that has been taken and using it as a determination criterion, the height of the wafer surface may be measured, and the flatness and attraction state determined.

Figure 2A:
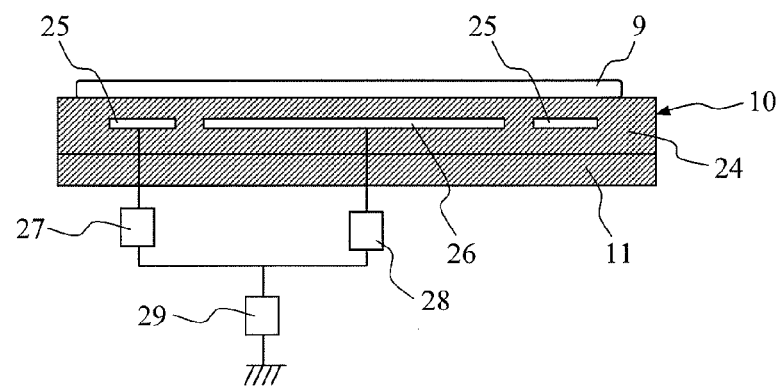
FIG. 2A is a diagram showing the configuration of an electrostatic chuck and a power circuit of related art.

The configuration of an electrostatic chuck and power circuit according to related art is described with reference to FIG. 2A. The electrostatic chuck 10 in the present example is a so-called bipolar electrostatic chuck, and is mounted on the Y stage 11 of the X-Y stage. The electrostatic chuck 10 comprises a main body 24 comprising a sintered ceramic made of alumina, a circular internal electrode 26 provided inside the main body, and a ring-shaped internal electrode 25. DC power sources 27 and 28 and a retarding power source 29 for causing the electrostatic chuck to operate are connected to these internal electrodes 25 and 26. The DC power sources 27 and 28 are connected to the retarding power source 29 by being superimposed in a floating manner. By thus imparting a potential difference across the internal electrodes using the DC power sources 27 and 28, it is possible to electrostatically attract the wafer 9 on the electrostatic chuck 10.

The retarding power source 29 is used to apply a decelerating voltage (retarding voltage) to the wafer. In order to enhance resolution, the electron beam incident on the wafer 9 is accelerated and focused by a high accelerating voltage. When a wafer is irradiated with such an electron beam, the device formed on the wafer is subjected to damage. As such, in order to reduce such damage, the electron beam incident on the wafer is decelerated just before hitting the wafer. By applying a retarding voltage, a negative electric field is generated, and the electron beam incident on the wafer decelerates.

It is noted that although, in the present example, a retarding voltage is applied to the electrostatic chuck 10, the configuration may also be such that a retarding voltage is applied directly to the wafer 9 via a contact pin, etc.

Figure 2B:
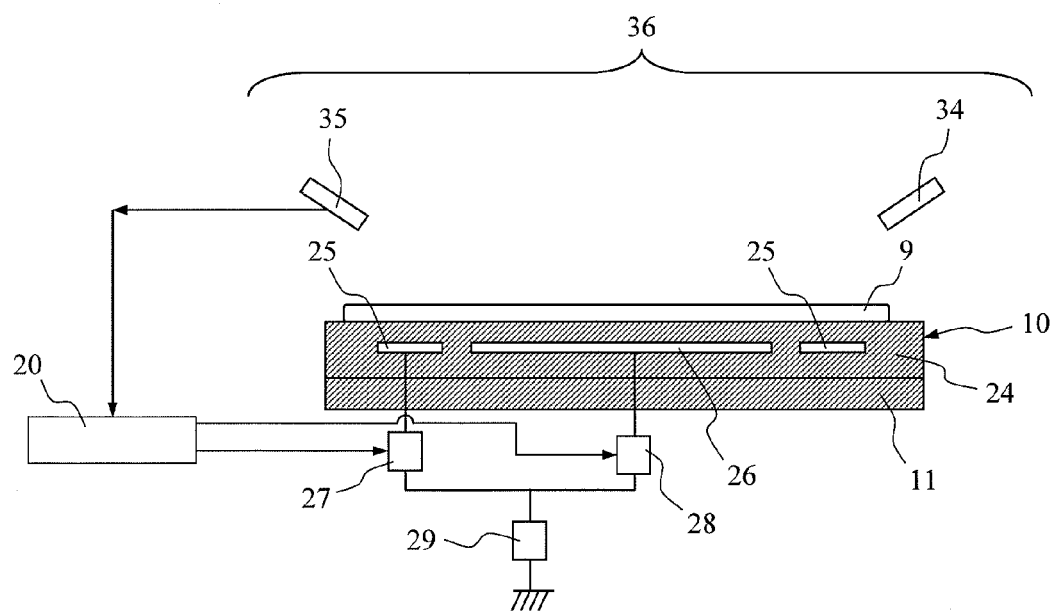
FIG. 2B is a diagram showing the configuration of an electrostatic chuck and a power circuit of the present invention.

An example of an electrostatic chuck of the present invention is described with reference to FIG. 2B. The electrostatic chuck 10 of the present example differs from the related electrostatic chuck shown in FIG. 2A in that there is provided an attraction state measuring device for measuring the attraction state of the wafer. The attraction state measuring device measures flatness as the attraction state of the wafer. Flatness refers to the height of a measurement point on the surface of the wafer from the surface of the electrostatic chuck as well as the height distribution. For the case at hand, as an example of the attraction state measuring device, an optical height measuring device 36 is described. The height measuring device 36 comprises the light emitter 34 and the light receiver 35. The light from the light emitter 34 is reflected at the wafer 9 and detected by the light receiver 35. Based on the position of the incident light detected by the light receiver 35, the control device 20 measures the flatness of the wafer.

Through the measurement results of the height measuring device 36, the flatness of the wafer, that is, the attraction state of the wafer mounted on the electrostatic chuck may be monitored. Based on the attraction state of the wafer, the control device 20 sets the application voltage for the electrostatic chuck to the optimal value. With the related electrostatic chuck, a high voltage of ±2 kV, by way of example, is applied to flat wafers with virtually no warping and wafers with warping on the order of several hundred μm alike. However, with the present invention, by way of example, the application voltage may be set to ±100 V in the case of a wafer with no warping, and to ±600 V in the case of a wafer that is warped by 100 μm.

Figure 3:
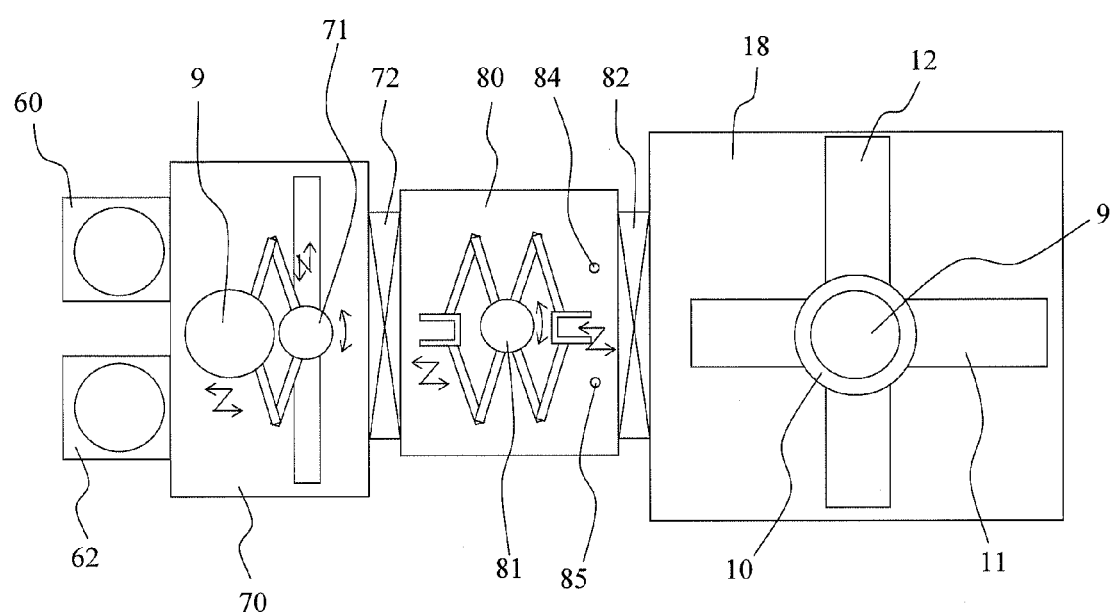
FIG. 3 is a diagram showing an example of the structure of a transportation path provided in a scanning electron microscope of the present invention.

An example of a wafer transportation path is described with reference to FIG. 3. FIG. 3 shows a plan configuration of the processing chamber 18 in the lower part of the housing 13 (FIG. 1) of a scanning electron microscope of the present example, a load chamber 80, and a preparation chamber 70. The X stage 12, the Y stage 11, and the electrostatic chuck 10 are disposed in the processing chamber 18. The wafer 9 is mounted on the electrostatic chuck 10. A transportation mechanism 71 that performs forward/rearward, extension/contraction, as well as rotary operations is provided in the preparation chamber 70. A transportation mechanism 81 that performs rotary and extension/contraction operations is provided in the load chamber 80. A gate valve 82 is provided between the processing chamber 18 and the load chamber 80. A gate valve 72 is provided between the load chamber 80 and the preparation chamber 70. The processing chamber 18 is maintained under high vacuum. The preparation chamber 70 is held at atmospheric pressure. The load chamber 80 is connected to one of the processing chamber 18 and the preparation chamber 70. When connecting the load chamber 80 to the processing chamber 18, the two gate valves 72 and 82 are closed, the load chamber 80 is evacuated, and just the second gate valve 82 is opened thereafter. When connecting the load chamber 80 to the preparation chamber 70, the two gate valves 72 and 82 are closed, the load chamber 80 is exposed to atmospheric pressure, and just the first gate valve 72 is opened thereafter.

When transporting a wafer to the processing chamber 18, the gate valve 82 is closed, the gate valve 72 is opened, and the load chamber 80 is placed under atmospheric pressure. A wafer of a load cassette 60 is transported to the load chamber 80 by the transportation mechanism 71 of the preparation chamber 70. Next, the gate valve 82 is opened, the gate valve 72 is closed, and the load chamber 80 is evacuated. The wafer is transported to the processing chamber 18 by the transportation mechanism 81 of the load chamber 80. Once the wafer is mounted on the electrostatic chuck 10, the gate valve 82 is closed. When returning the wafer from the processing chamber 18 to an unload cassette 62, it is transported along the path in reverse.

In the present example, a flatness measuring device that measures the flatness of the wafer is provided in the load chamber 80. Flatness refers to the height of a measurement point on the surface of the wafer from the surface on which the wafer is placed as well as the height distribution. For the case at hand, as an example of the wafer flatness measuring device, an optical height measuring device is described. The height measuring device comprises a light emitter 84 and a light receiver 85. The light from the light emitter 84 is reflected at the wafer 9 and detected by the light receiver 85. Based on the position of the incident light detected by the light receiver 85, the control device 20 (FIG. 1) measures the height and the height distribution of the wafer.

Although the wafer is ideally a flat planar plate member, in reality, it is, albeit slightly, warped. As warp modes of wafers, there are the convex type, concave type, and other types, but they are ordinarily either of the convex type or the concave type. The term convex type refers to cases where the surface on which the pattern is formed is outwardly convex, whereas the term concave type refers to cases where the surface on which the pattern is formed is outwardly concave.

The wafer flatness measuring device measures the flatness of the wafer, that is, the height of a measurement point on the surface of the wafer as well as the height distribution. To this end, the surface of the waver is divided into a plurality of regions. The surface of the wafer may be divided into concentric ring-shaped regions, as well as into grid-like regions. By measuring the height of each region, the height and height distribution of the wafer are obtained. Based on the flatness distribution of the wafer, the control device 20 (FIG. 1) detects the warp mode of the wafer.

The wafer flatness measuring device may be provided inside or outside the load chamber 80. If it is provided outside the load chamber 80, the load chamber 80 would be provided with an observation window, and the light emitter 84 and light receiver 85 would be provided thereat. It is noted that the wafer flatness measuring device may also be provided at the preparation chamber 70.

Figure 4:
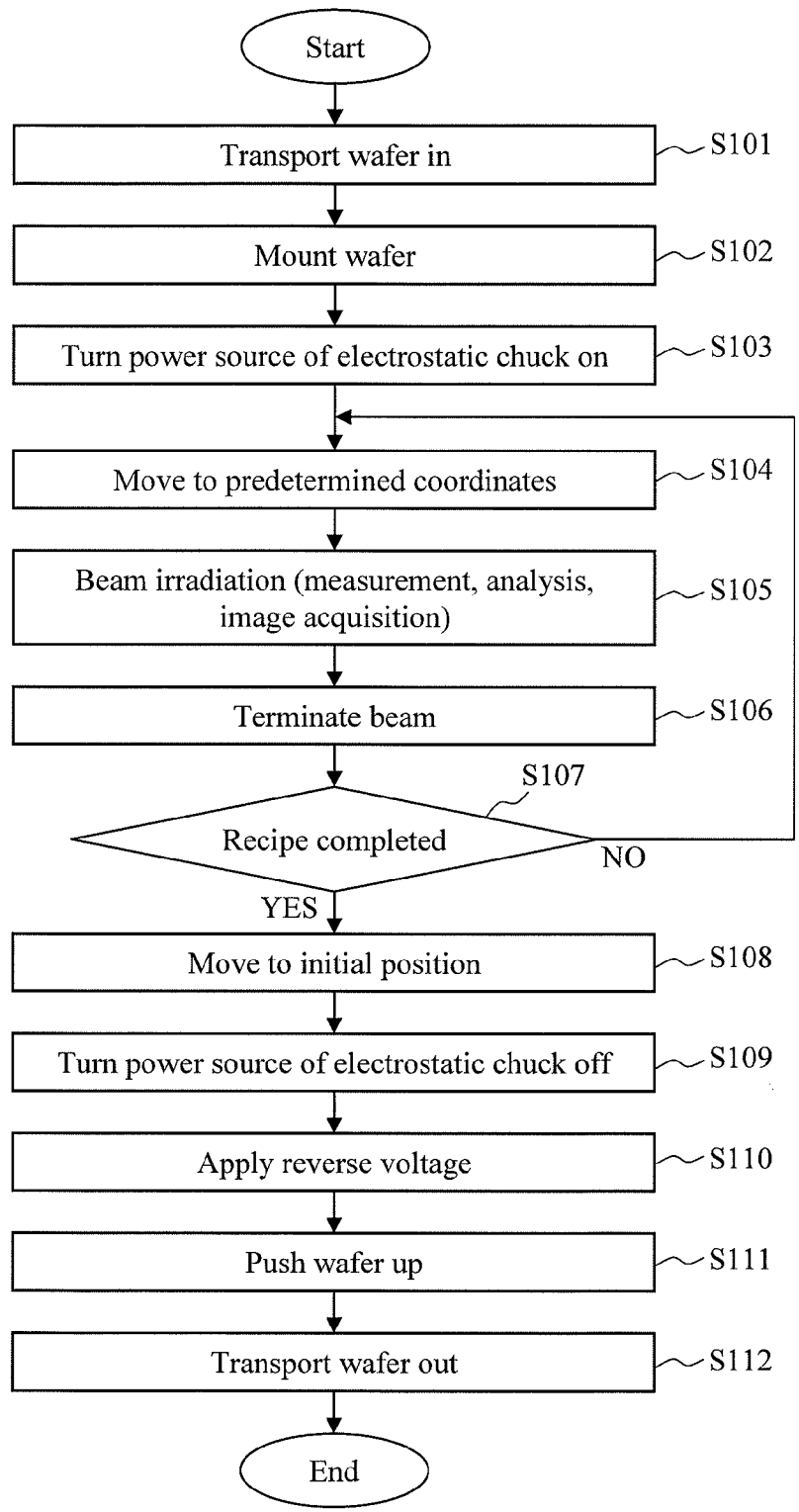
FIG. 4 is a diagram showing an example of an inspection method using a scanning electron microscope of related art.

An example of a wafer inspection (measurement, analysis, image acquisition, etc.) method using a scanning electron microscope according to related art is described with reference to FIG. 4. In step S101, a wafer is transported into the processing chamber 18 of the housing 13 of the scanning electron microscope by means of a transportation mechanism. In step S102, the wafer is mounted on the electrostatic chuck. As discussed above, while several types of electrostatic chucks are known, such as Coulomb electrostatic chucks, Johnsen-Rahbek electrostatic chucks, etc., it is herein assumed to be a Coulomb electrostatic chuck. In step S103, the DC power source of the electrostatic chuck is turned on, and a predetermined voltage is applied. As a result, the wafer is electrostatically attracted to the electrostatic chuck.

The application voltage required to electrostatically attract the wafer in a stable manner depends on the type of the electrostatic chuck and the kind and condition of the wafer. In the case of a Johnsen-Rahbek electrostatic chuck whose dielectric film has a specific resistance of approximately $1 \times 10^9$ Ωcm to $10^{12}$ Ωcm, it would be approximately ±300 V to approximately ±600 V. In the case of a Coulomb electrostatic chuck whose dielectric film has a greater specific resistance, it would be ±1000 V to ±2000 V, approximately.

Next, in step S104, the X-Y stage is operated, and the wafer moved to a predetermined coordinate position, so as to place the inspection target on the wafer at the electron beam irradiation position. The term inspection target on the wafer as used above refers to a predetermined region of a chip that is to be measured, analyzed, and for which an image is to be obtained.

In step S105, wafer inspection (measurement, analysis, image acquisition, etc.) is performed in accordance with recipe conditions. Recipe conditions include beam irradiation conditions, inspection target coordinate information, etc., and are inputted to/stored on a control device that is not shown in the drawings Once inspection (measurement, analysis, image acquisition, etc.,) is finished, beam irradiation is terminated in step S106. In step S107, it is determined whether or not a pre-set recipe has been completed. If the recipe has not been completed, step S104 to step S106 are repeated. If the recipe has been completed, the process proceeds to step S108, and the X-Y stage is operated to move the wafer to the initial position. In other words, the electrostatic chuck on which the wafer is mounted is moved to the initial position. In step S109, the DC power source of the electrostatic chuck is turned off to terminate voltage application.

Even when the application voltage for the electrostatic chuck is terminated, residual charge sometimes occurs between the surfaces of the wafer and the electrostatic chuck. Due to the residual charge, a residual attraction force occurs. The residual attraction force becomes greater as the semiconductor wafer grows larger in diameter. In other words, even if the residual attraction force per unit area is the same, if the semiconductor wafer is larger in diameter, the force exerted on the wafer as a whole becomes greater. Given the trend towards greater diameters being advanced in recent years to reduce fabrication costs, this becomes a significant problem. Residual charge may occur in both a Coulomb electrostatic chuck as well as a Johnsen-Rahbek electrostatic chuck. As such, in order to cancel out the residual charge, a reverse voltage is applied in step S110.

In step S111, the lift pins are raised to release the wafer from the electrostatic chuck. In step S112, the wafer is transported out.

In the related method, a reverse voltage is applied in step S110 to cancel out the residual charge. However, it is undesirable that further residual charge remain due to the reverse voltage being too high or too low. As such, an estimated value of residual charge amount is calculated, and the reverse voltage required to cancel out this estimated value is calculated. The estimated value of residual charge amount may be obtained by monitoring the current that flows when a similar wafer is released. Accordingly, in the related method, there must be a step of estimating the amount of residual charge, a step of calculating a reverse voltage value based on the estimated value of reside al charge amount, and a step of applying a reverse voltage. Thus, not only does the configuration become complex, but there also arises a problem of diminished throughput.

In addition, if charged foreign particles are present on the surface of the electrostatic chuck, applying a reverse voltage may potentially cause, due to the electrostatic force generated thereby, the foreign particles to transfer to the reverse side of the wafer. As a result, there is also the problem that the amount of foreign particles found on the reverse side of the wafer increases. Foreign particles on the reverse side of the wafer become diffused in bulk silicon to affect electrical properties, and, further, in the next step, they become transferred to the front side of the wafer to cause adverse effects.

Accordingly, it is generally preferable that the occurrence of residual charge be prevented. In order to prevent the occurrence of residual charge, the voltage applied to the electrostatic chuck should be made to be as close to zero as possible. However, an electrostatic chuck has the function of flattening wafers. For this reason, it is necessary to operate the electrostatic chuck with the application voltage kept as low as possible. The minimum voltage value required to securely hold a wafer as well as to flatten it varies depending on the electrostatic system, wafer conditions, etc. As such, with the present invention, an appropriate requisite minimum application voltage value is calculated for each wafer, and the application of an unnecessarily high voltage is avoided.

Figures 5, 6:
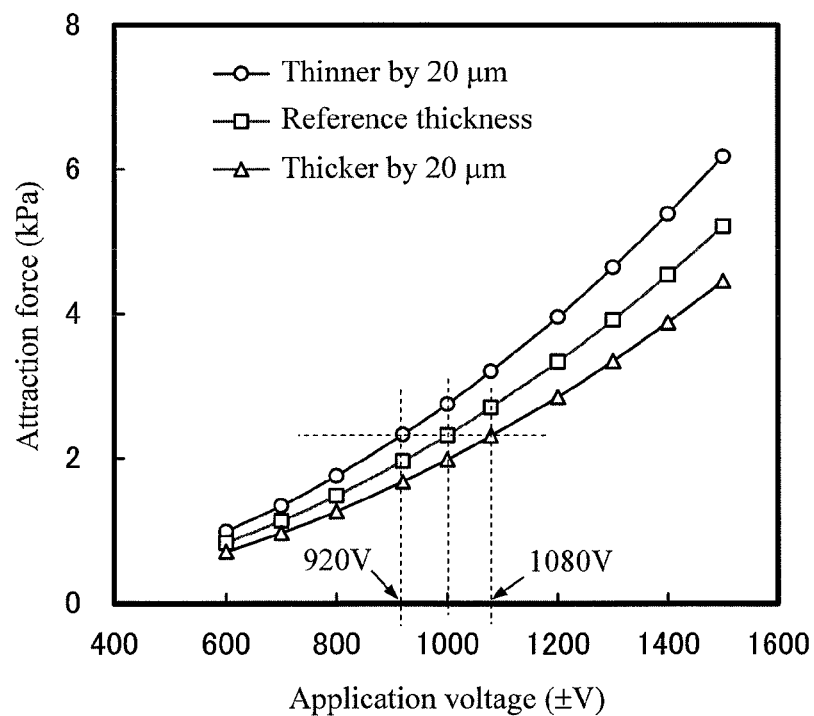
FIG. 5 is a diagram illustrating a method of setting an application voltage for an electrostatic chuck and increments based on the results of experiments conducted by the present inventors.
FIG. 6 is a diagram illustrating a method of setting increments of an application voltage for an electrostatic chuck based on the results of experiments conducted by the present inventors.

A method of calculating an optimal value for the application voltage of an electrostatic chuck according to the present invention is described with reference to FIG. 5. FIG. 5 shows an example of results from a wafer attraction experiment with respect to an electrostatic chuck conducted by the present inventors. The wafers used for the experiment of FIG. 5 were wafers with no warping, and wafers of convex and concave warp modes having a predetermined warp (of several hundred μm). The DC voltage applied to the electrostatic chuck was increased in increments of 100 V, and the attraction states of the wafers were observed. In FIG. 5, a circle denotes a good attraction state, whereas a cross denotes a bad attraction state. The attraction state was determined to be good if the flatness of the wafer attracted to the electrostatic chuck was sufficient, and to be bad if the flatness was insufficient. In this case, flatness may be determined by the height of the wafer. According to the present invention, from the results of the wafer attraction experiment, the application voltage of the electrostatic chuck is set in the manner described below.

According to the results shown in FIG. 5, in the case of the concave warp mode wafer, the attraction state was "bad" at an application voltage of 900 V, but "good" at an application voltage of 1000 V. As such, according to the first example of the present invention, in the case of a concave warp mode wafer, the initial voltage of the electrostatic chuck is set to $V_0$=900 V, and the application voltage is incremented. As the application voltage is increased, the attraction state should change from "bad" to "good." The application voltage at which the attraction state changed to "good" is taken to be the optimal value for the application voltage. Thus, in the first example of the present invention, the attraction state needs to be observed while increasing the application voltage from the initial voltage in increments of $\Delta V$. The increment $\Delta V$ for the application voltage may be, for example, a fifth of 100 V, i.e., 20V, or it may also be one half of 100 V, i.e., 50 V.

According to the second example of the present invention, in the case of a concave warp mode wafer, the optimal value for the application voltage is set to $V_0$=1000 V. Since, in this case, the attraction state would be "good," there is no need to increase the application voltage, and the attraction state need not be observed. There is no need to set increment $\Delta V$ for the application voltage.

According to the results shown in FIG. 5, in the case of the convex warp mode wafer, the attraction state was "bad" at an application voltage of 1000 V, but "good" at an application voltage of 1100 V. As such, according to the first example of the present invention, in the case of a convex warp mode wafer, the initial voltage is set to $V_0$=1000 V, and the application voltage is incremented. As the application voltage is increased, the attraction state should change from "bad" to "good." The application voltage at which the attraction state changed to "good" is taken to be the optimal value for the application voltage. The increment $\Delta V$ for the application voltage may be, for example, a fifth of 100 V, i.e., 20V, or it may also be one half of 100 V, i.e., 50 V. According to the second example of the present invention, in the case of a convex warp mode wafer, the optimal value for the application voltage is set to $V_0$=1100 V. Since, in this case, the attraction state would be "good," there is no need to increase the application voltage, and the attraction state need not be observed. Accordingly, there is no need to set increment $\Delta V$ for the application voltage.

According to the results shown in FIG. 5, for the unwarped wafer, the attraction state was "good" at an application voltage of 100 V. Accordingly, with an unwarped wafer, the attraction state might be "bad" at an application voltage of 50 V, for example. As such, according to the first example of the present invention, in the case of an unwarped wafer, the initial voltage of the electrostatic chuck is set to $V_0$=50 V, and the application voltage is incremented. The application voltage at which the attraction state changed to "good" is taken to be the optimal value for the application voltage. The increment ΔV for the application voltage may be, for example, a fifth of 50 V, i.e., 10V. According to the second example of the present invention, in the case of an unwarped wafer, the optimal value for the application voltage of the electrostatic chuck may be set to $V_0=100$ V. In this case, there is no need to increase the application voltage, and the attraction state need not be observed. There is no need to set increment ΔV for the application voltage.

Thus, according to the present invention, a wafer attraction experiment with respect to the electrostatic chuck is conducted, the application voltage is increased, and the application voltage at which the attraction state changed from "bad" to "good" is stored. In the first example of the present invention, with respect to the results obtained from the attraction experiment, the application voltage immediately before the attraction state changes from "bad" to "good" is taken to be the initial voltage value. In this case, increment ΔV for the application voltage is set. Increment ΔV is decided by an administrator or a user. In this case, during wafer inspection, the application voltage is increased while observing the attraction state, and the application voltage at which the attraction state changed from "bad" to "good" is taken to be the optimal value.

By setting increment ΔV for the application voltage to a relatively small value, it is possible to accurately obtain the optimal application voltage, but it will take longer to obtain the optimal application voltage. On the contrary, by setting increment ΔV for the application voltage to a relatively large value, the optimal application voltage may not be obtained accurately, but it will take less time to obtain the optimal application voltage. However, according to the present example, initial voltage value $V_0$ to be applied to the electrostatic chuck is less than the application voltage value used in step S103 of the related method described with reference to FIG. 4.

In the second example of the present invention, with respect to the results obtained in the attraction experiment, the application voltage immediately after the attraction state changed from "bad" to "good" is taken to be the optimal value for the application voltage. In this case, no increment ΔV is set.

The attraction experiment results in FIG. 5 were obtained using an unwarped wafer, and wafers of convex and concave warp modes having a warp of several hundred μm. Accordingly, similar results are obtained when the degree of warp is varied. Such a collection of data is stored on the control device 20. Accordingly, if the mode and degree of warp are known, it is possible to find out the application voltages before and after the attraction state changes from bad to good. Accordingly, an initial voltage and increments may be derived according to the first example of the present invention, or the optimal value for the application voltage may be derived according to the second example of the present invention.

In this case, the term degree of warp refers to the maximum value of the height of the wafer surface. In other words, in the case of a convex mode warp, the height at the center becomes the degree of warp. In addition, in the case of a concave mode warp, the height at the perimeter becomes the degree of warp.

In this experiment, the DC voltage applied to the electrostatic chuck was increased in increments of 100 V and the attraction state was detected. However, the voltage increments need not necessarily be 100 V. In the present example, the initial voltage and the increments were determined based on a comparative table on attractability such as that shown in FIG. 5. However, the initial voltage and the increments may also be calculated based on, for example, a conversion equation that takes warp amount as a parameter, instead of on a comparative table.

FIG. 6 shows examples of results of measuring the attraction force of an electrostatic chuck that were conducted by the present inventors. The horizontal axis represents application voltage (±V), and the vertical axis attraction force (Pa). The attraction force of the electrostatic chuck generally varies with the application voltage. In other words, as the application voltages increases, the attraction force of the electrostatic chuck increases. On the other hand, there is some variation in the thickness of the ceramic dielectric film of the electrostatic chuck, such variation being on the order of several tens of microns relative to a reference thickness. The application voltage for generating the same attraction force consequently has some range. The design tolerance is ordinarily approximately ±20 μm. As such, the present inventors studied the relationship between application voltage and attraction force using three electrostatic chucks, namely an electrostatic chuck with a dielectric film whose thickness is equal to the reference value, an electrostatic chuck with a dielectric film whose thickness is greater than the reference value by 20 μm, and an electrostatic chuck with a dielectric film whose thickness is less than the reference value by 20 μm.

According to the results shown in FIG. 6, for example, in order to generate an attraction force of 2.3 kPa, the application voltage is 1000 V for the electrostatic chuck with a dielectric film whose thickness is equal to the reference value, whereas the application voltage is 920 V for the electrostatic chuck with a dielectric film whose thickness is less than the reference value by 20 μm. In addition, the application voltage is 1080 V for the electrostatic chuck with a dielectric film whose thickness is greater than the reference value by 20 μm. In other words, in the present example, the application voltage required to generate an attraction force of 2.3 kPa has a range of 160 V. Accordingly, increment ΔV for the application voltage may, for example, be a quarter of 160 V, i.e., 40 V.

In the present example, too, by setting increment ΔV for the application voltage to a relatively small value, it is possible to accurately obtain the optimal application voltage, but it will take longer to obtain the optimal application voltage. On the contrary, by setting increment ΔV for the application voltage to a relatively large value, the optimal application voltage may not be obtained accurately, but it will take less time to obtain the optimal application voltage.

The first example of a method of inspecting (measuring, analyzing, acquiring an image, etc.) a wafer using a scanning electron microscope of the present invention is described with reference to FIG. 7. In step S201, a wafer is transported along a transportation path by an unillustrated transportation mechanism. The term "transportation path" as used above refers to a path for transporting a wafer to the processing chamber 18 of the scanning electron microscope, and comprises, in the example in FIG. 3, the load chamber 80 or the preparation chamber 70. Next, in step S202, at the transportation path, the wafer's flatness, that is, its height and height distribution, is measured by a wafer flatness measuring device. The wafer flatness measuring device has been described with reference to FIG. 3. In step S203, the wafer's degree and mode of warp are detected by the control device 20. The wafer's degree of warp may be the maximum value of the wafer's height. The wafer's warp mode may be unwarped, convex mode, or concave mode.

In step S204, initial voltage $V_0$ to be applied to the electrostatic chuck is calculated, and increment ΔV for the application voltage is set. Specifically, based on electrostatic chuck attraction experiment results stored on the control device 20, initial voltage $V_0$ and increment $\Delta V$ for the application voltage are set. Methods of setting initial voltage $V_0$ and increment $\Delta V$ for the application voltage have been described with reference to FIG. 5 and FIG. 6.

In step S205, the wafer is transported into the processing chamber 18 of the housing 13 of the scanning electron microscope by a transportation mechanism. An example of the transportation mechanism is shown in FIG. 3. In step S206, the wafer is mounted on the electrostatic chuck. As discussed above, several types of electrostatic chucks are known, such as Coulomb electrostatic chucks, Johnsen-Rahbek electrostatic chucks, etc. Although it may be any type of electrostatic chuck according to the present invention, it is herein assumed to be a Coulomb electrostatic chuck. In step S207, the DC power source of the electrostatic chuck is turned on, and initial voltage $V_0$, which has been set in step S204, is applied. As a result, the wafer is electrostatically attracted to the electrostatic chuck.

In step S208, the wafer's flatness is measured. The term wafer's flatness as used here refers to the wafer's height and height distribution. For this measurement, the height measuring device described with reference to FIG. 2B may be used. In step S209, it is determined whether or not the wafer's flatness falls within a reference value. If it is determined that the wafer's flatness does not fall within the reference value, it is determined that the attraction force of the electrostatic chuck is not sufficient, that is, that the application voltage is insufficient, and the process proceeds to step S210. In step S210, the application voltage is increased by increment $\Delta V$. Increment $\Delta V$ has been set in step S204. If, in step S209, it is determined that the wafer's flatness does fall within the reference value, the process proceeds to step S104.

Step S104 to step S109 are similar to step S104 to step S109 of the related method described in connection with FIG. 4. In step S109, the DC power source of the electrostatic chuck is turned off, and voltage application is terminated. In step S109*a*, it is determined whether or not it is necessary to apply a reverse voltage. By way of example, it is determined that no reverse voltage needs to be applied if the voltage applied when performing wafer inspection falls within a predetermined reference value, and it is determined that a reverse voltage needs to be applied if it does not fall within the reference value. If it is determined that a reverse voltage needs to be applied, the process proceeds to step S110 and a reverse voltage is applied. If it is determined that no reverse voltage needs to be applied, the process proceeds to step S111. Step S111 and step S112 are similar to step S111 and step S112 of the related method described in connection with FIG. 4. It is noted that, in the present example, step S109*a* and step S110 may be omitted.

In the present example, in step S201, wafers are transported to the transportation path wafer by wafer, in order, and successively. Accordingly, by way of example, while the first wafer is undergoing the inspection of step S105 by the scanning electron microscope, the second wafer undergoes the measurement of step S202. While the second wafer is undergoing the transportation of step S101 into the scanning electron microscope by the transportation mechanism, the third wafer undergoes the transportation of step S201 to the transportation path by the transportation mechanism.

Figure 7:
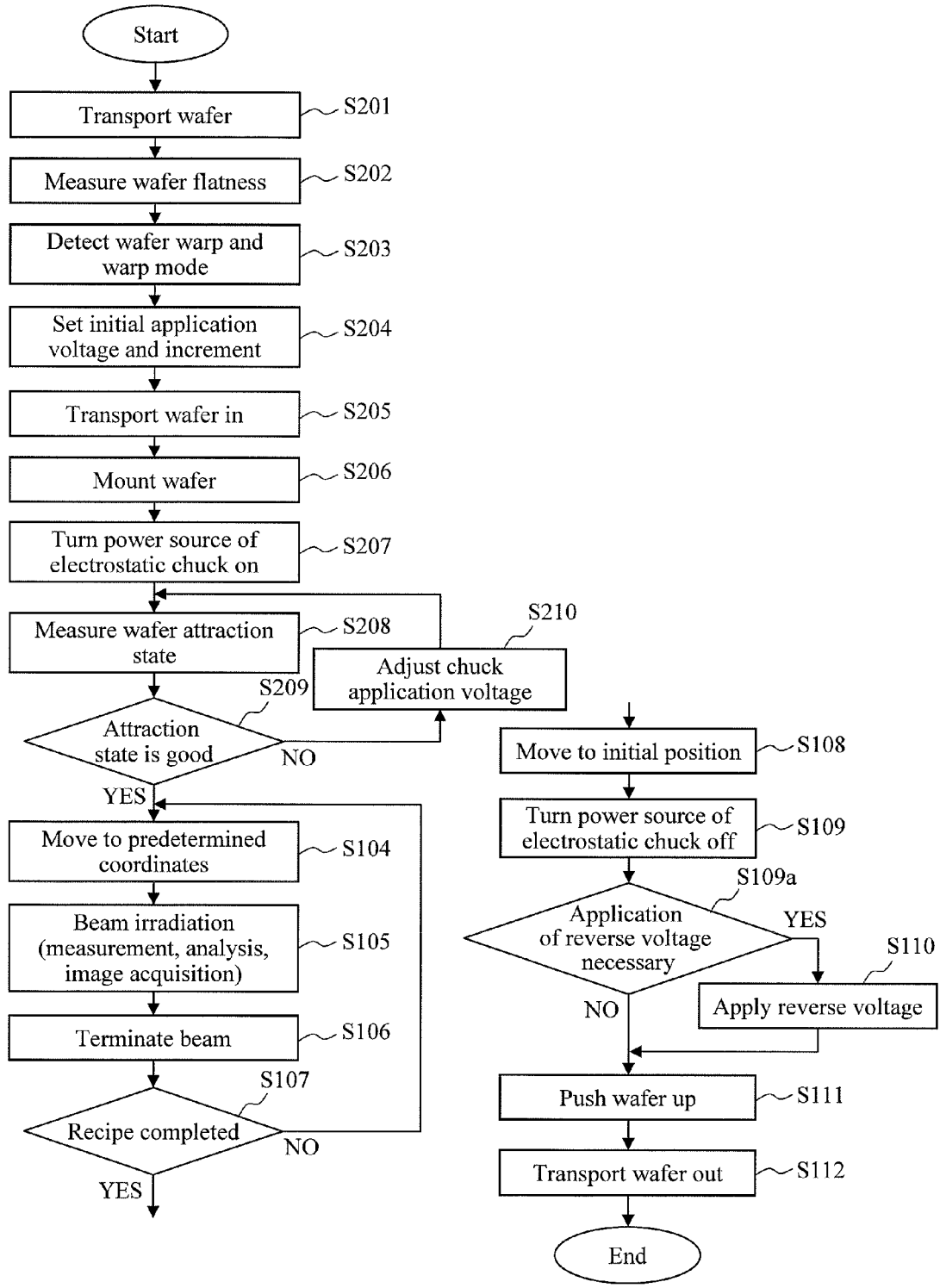
FIG. 7 is a diagram showing the first example of an inspection method using a scanning electron microscope of the present invention.

According to the first example of the present invention shown in FIG. 7, the minimum voltage required to attract a wafer in a flattened state is applied to the electrostatic chuck. It is thus possible to minimize the residual charge amount generated between the wafer and the electrostatic chuck. Accordingly, the application of a reverse voltage for cancelling out the residual charge is either unnecessary or may be minimized. Thus, not only does throughput improve, but it is also possible to provide a highly reliable measuring device that is capable of operating stably over a long period of time.

In addition, according to the present example, the application voltage for the electrostatic chuck is adjusted until the wafer's flatness falls within a reference value. Thus, the wafer is inspected and transported to the next step in a state where there is complete attraction with respect to the electrostatic chuck. Thus, it is possible to prevent the wafer from falling off the stage during transportation. In other words, it is possible to provide a highly reliable measuring device free of transportation errors.

Further, since it is possible to keep the attraction force for attracting the wafer to the minimum requisite value, it is possible to minimize the aging of the surface of the electrostatic chuck. In other words, it is possible to provide a long-life measuring device. In addition, since it is possible to keep the attraction force low, the pressure at the interface between the wafer and the electrostatic chuck may also be kept low. Accordingly, one may expect an effect where the adhesion of foreign particles to the reverse side of the wafer decreases. In experiments by the inventors, when the application voltage for the electrostatic chuck was changed from $\pm 1500$ V to $\pm 100$ V, the results obtained were such that the number of foreign particles on the reverse side of the silicon wafers after attraction decreased by a factor of 1/20 or more.

In addition, although, in the method of the present example, the voltage applied to the electrostatic chuck is adjusted per wafer, this is not actually necessary. By way of example, in a manufacturing line where wafers of the same specifications flow successively, the application voltage may instead be adjusted per lot. In addition, in a manufacturing line where wafers of the same specifications flow over extended periods of time, the application voltage may ordinarily be adjusted according to a method of the present embodiment and the application voltage may be reviewed when deemed appropriate by the user.

Figure 8:
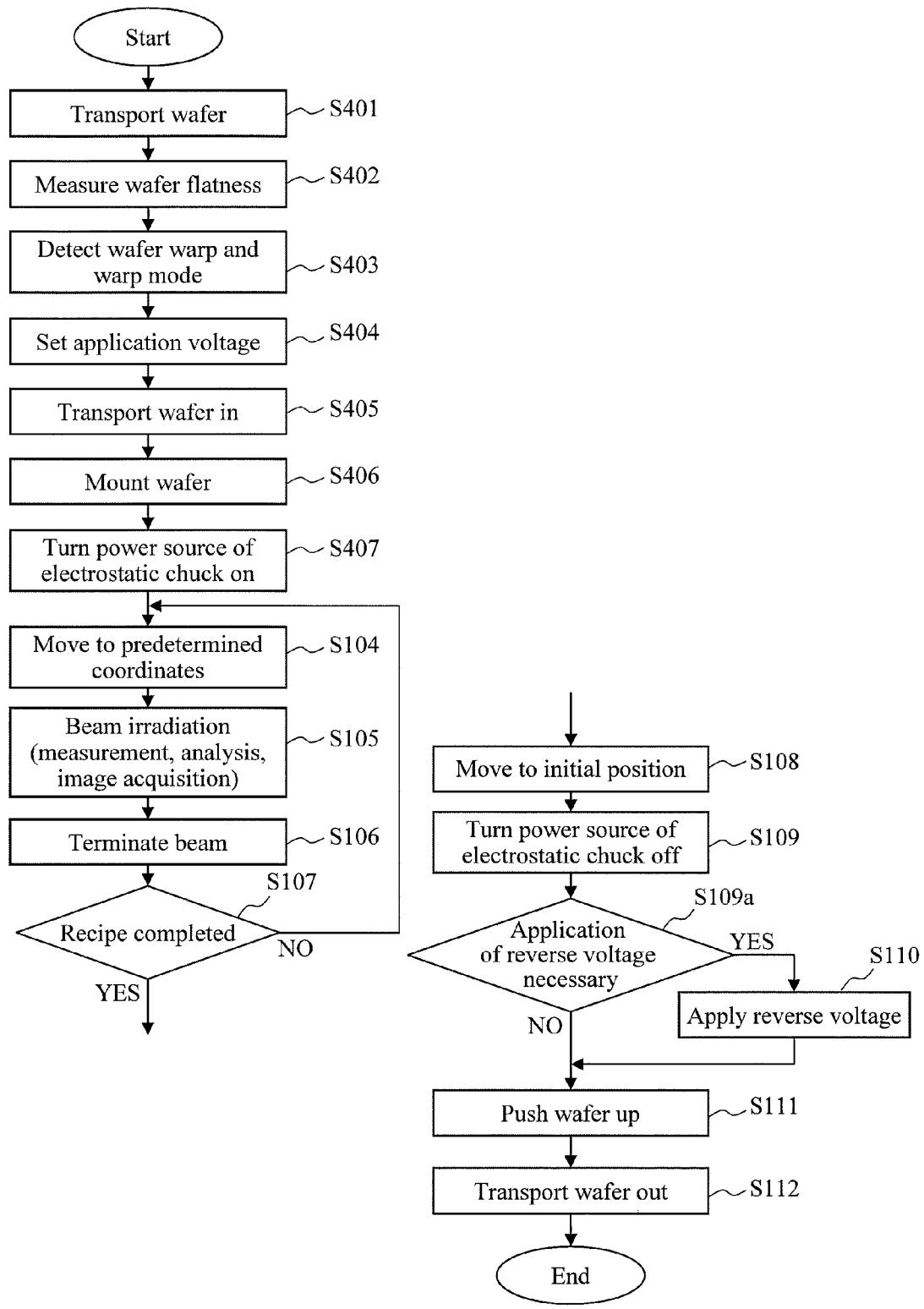
FIG. 8 is a diagram showing the second example of an inspection method using a scanning electron microscope of the present invention.

The second example of a method of inspecting (measuring, analyzing, acquiring an image, etc.) a wafer using a scanning electron microscope of the present invention is described with reference to FIG. 8. Step S401 to step S403 are similar to step S201 and step S203 of the first example described with reference to FIG. 7. In step S404, the optimal value for the application voltage of the electrostatic chuck is set. In other words, based on the results of attraction experiments for the electrostatic chuck stored on the control device 20, the optimal value for the application voltage is set. A method of setting the optimal value for the application voltage has been described with reference to FIG. 5.

Step S405 and step S406 are similar to step S205 and step S206 of the first example described with reference to FIG. 7. In step S407, the DC power source of the electrostatic chuck is turned on, and the optimal value for application voltage V is applied. The optimal value for application voltage V has been set in step S404. Thus, the wafer is electrostatically attracted to the electrostatic chuck.

Subsequent step S104 through step S112 are similar to step S104 through step S112 of the first example described with reference to FIG. 7. It is noted that step S109*a* and step S110 may be omitted.

In the present example, too, as in the example of FIG. 7, wafers are transported to the transportation path wafer by wafer, in order, and successively in step S401. Accordingly, by way of example, while the first wafer is undergoing the inspection of step S105 by the scanning electron microscope, the second wafer undergoes the measurement of step S402. While the second wafer is undergoing the transportation of step S101 into the scanning electron microscope by the transportation mechanism, the third wafer undergoes the transportation of step S401 to the transportation path by the transportation mechanism.

In the present example, prior to inspection by the scanning electron microscope, the flatness of the wafer is measured, and the voltage value to be applied to the electrostatic chuck is calculated. Further, the measuring of the wafer's flatness and the setting of the application voltage for the electrostatic chuck are performed while the previous wafer is undergoing inspection by the scanning electron microscope. Thus, high throughput may be attained.

In addition, even if a wafer of a size that differs from wafer sizes specified by standards, e.g., a reclaim wafer, were to flow, it would be possible to prevent the occurrence of attraction errors, etc., through height measurements by the height measuring instrument.

Next, before describing the third example of the present invention, a technique for suppressing the beam bending amount at the wafer perimeter with respect to a scanning electron microscope is described.

Figure 9:
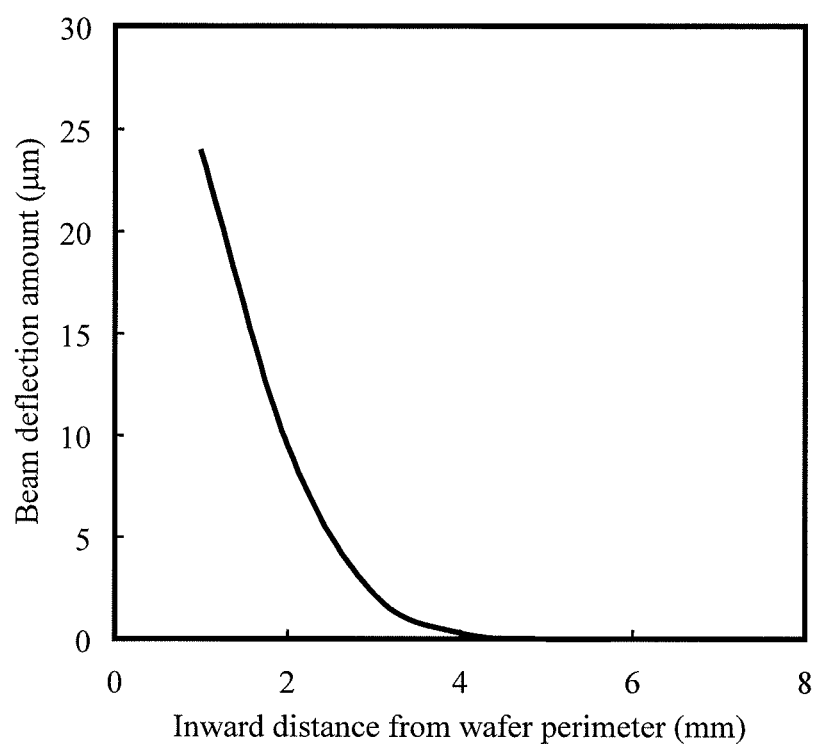
FIG. 9 is a diagram showing an example of a calculation result of the relationship between the distance from the wafer perimeter and the deflection amount of the electron beam with respect to a scanning electron microscope.

FIG. 9 is a graph showing the deflection amount of an electron beam at a perimeter part of a wafer. This graph shows an example of the results of calculating the deflection amount of an electron beam with respect to a case where a device on a wafer is measured according to related art. The horizontal axis in FIG. 9 represents the distance (mm) measured radially inward from the perimeter of the wafer, and the vertical axis the beam deflection amount (μm) with respect to the surface of the sample. Although the beam deflection amount varies depending on various conditions such as the value of the retarding voltage, the accelerating voltage, etc., since these conditions are not directly relevant to the essence of the present invention, their details are omitted. As shown in the diagram, up to the position of 4 mm measured radially inward from the outer edge of the wafer, electron beam bending occurs. However, at the region further radially inward than the 4 mm position, no beam bending occurs. Accordingly, when performing wafer inspection at the ring-shaped region approximately 4 mm in width at the outer edge of the wafer, the measurement position error is magnified.

Figure 10:
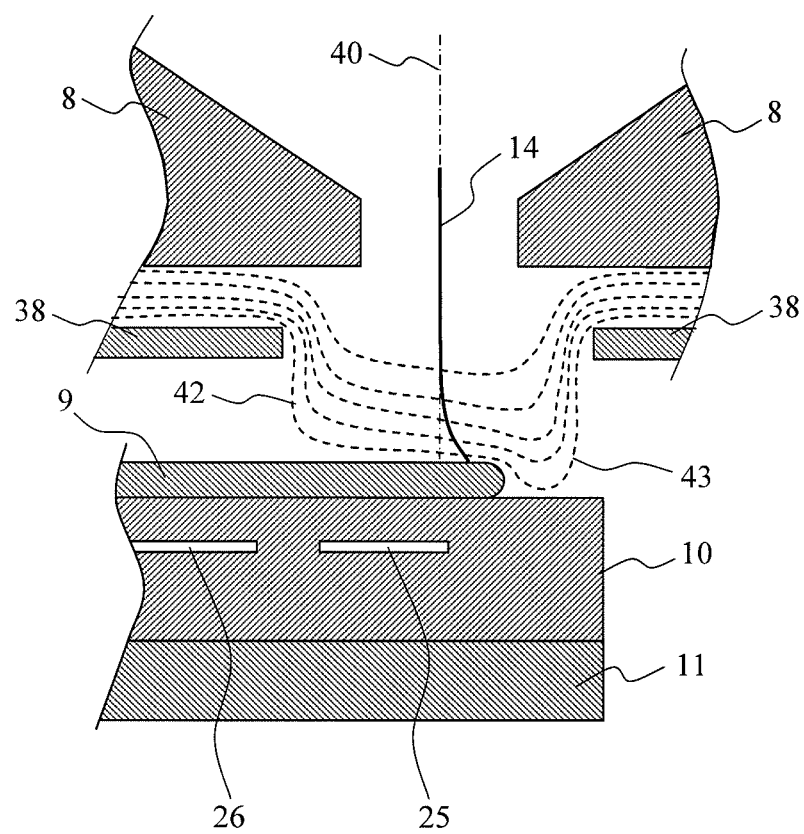
FIG. 10 is a diagram illustrating a method of measuring near the perimeter of a wafer with a related scanning electron microscope.

What causes beam bending near the perimeter of the wafer is described with reference to FIG. 10. FIG. 10 is a partial view of a related scanning electron microscope. As shown in the diagram, the electrostatic chuck 10 is mounted on the Y stage 11, and the wafer 9 is attracted and held thereabove. A level difference is formed between the outer edge of the wafer 9 and the electrostatic chuck 10. The objective lens 8 is disposed above the wafer 9, and a potential regulating plate 38 is provided therebelow. A voltage is applied to the potential regulating plate 38 in order to adjust the potential above the wafer. The outer diameter of the ring-shaped internal electrode 25 of the electrostatic chuck 10 is less than the outer diameter of the wafer 9.

It is assumed that the pattern of a device formed near the outer edge of the wafer 9 is measured. An optical axis 40 is so disposed as to pass through a measurement position located slightly more inward than the outer edge of the wafer 9. The electron beam 14 is focused by the objective lens 8 so as to form a focal point at the measurement position on the wafer 9. However, the level difference at the outer edge of the wafer 9 lies within the electric field generated by the objective lens 8. Consequently, the potential distribution becomes asymmetrical about the optical axis 40 as shown in the diagram.

While potential distribution 42 on the inner side relative to the optical axis 40 exhibits a normal potential distribution, potential distribution 43 on the outer side relative to the optical axis 40 is disturbed and deformed. In other words, due to the level difference at the outer edge of the wafer 9, the potential distribution shows erratic deformation. Consequently, as shown in the diagram, when the optical axis 40 is located slightly more inward than the outer edge of the wafer 9, due to the asymmetrical potential distribution 43, the electron beam 14 bends its trajectory just before hitting the wafer 9.

However, when the optical axis 40 is located sufficiently inward relative to the outer edge of the wafer 9, since the potential distribution 42 is not disturbed, the electron beam 14 is incident without bending its trajectory.

Figure 11:
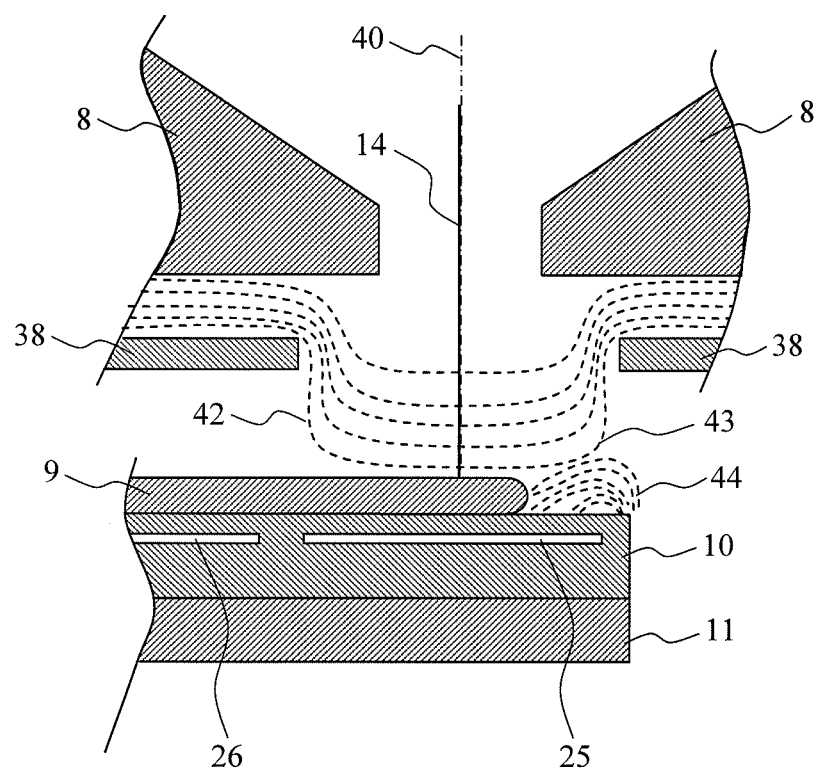
FIG. 11 is a diagram illustrating a method of measuring near the perimeter of a wafer with a scanning electron microscope of the present invention.

An example of the structure of an electrostatic chuck according to the present invention is described with reference to FIG. 11. FIG. 11 is a partial view of a scanning electron microscope according to the present invention. As shown in the diagram, the electrostatic chuck 10 is mounted on the Y stage 11, and the wafer 9 is attracted and held thereabove. A level difference is formed between the outer edge of the wafer 9 and the electrostatic chuck 10. The objective lens 8 is disposed above the wafer 9, and the potential regulating plate 38 is provided therebelow. A voltage is applied to the potential regulating plate 38 in order to adjust the potential above the wafer.

According to the present example, the outer diameter of the ring-shaped internal electrode 25 of the electrostatic chuck 10 is greater than the outer diameter of the wafer 9. When a relatively large negative DC voltage is applied to the electrostatic chuck 10, potential distribution 44 is generated outside of the wafer 9. The disturbance in the potential distribution generated by the objective lens 8 is corrected by this electric field 44. Specifically, of the potential distribution generated by the objective lens 8, the potential distribution 43 that lies outside of the wafer is pushed upward. Consequently, the potential distributions 42 and 43 of the electric field generated by the objective lens 8 become symmetrical in form about the optical axis 40. Thus, it is possible to suppress the bend in the trajectory of the electron beam 14.

Thus, in the present example, the outer diameter of the ring-shaped internal electrode 25 of the electrostatic chuck 10 is made to be greater than the outer diameter of the wafer 9. Further, a relatively large voltage is applied to the electrostatic chuck 10 in order to suppress the bend in the trajectory of the electron beam 14. The magnitude of this application voltage varies depending on the structure of the electrostatic chuck, the accelerating voltage for the electron beam, the retarding voltage, etc. However, this application voltage is greater than the above-discussed minimum application voltage required to attract the wafer in a flattened state. Accordingly, while the application voltage for suppressing the bend in the trajectory of the electron beam 14 is necessary when the inspection target is near the outer edge of the wafer, it is not appropriate if the inspection target is elsewhere.

As such, according to the present invention, when the inspection target is near the outer edge of the wafer, the voltage to be applied to the electrostatic chuck is made to be relatively large in order to suppress the bend in the trajectory of the electron beam 14. On the other hand, when the inspection target is at a position other than near the outer edge of the wafer, the voltage to be applied to the electrostatic chuck is made to be the minimum value required to attract the wafer in a flattened state.

Figure 12:
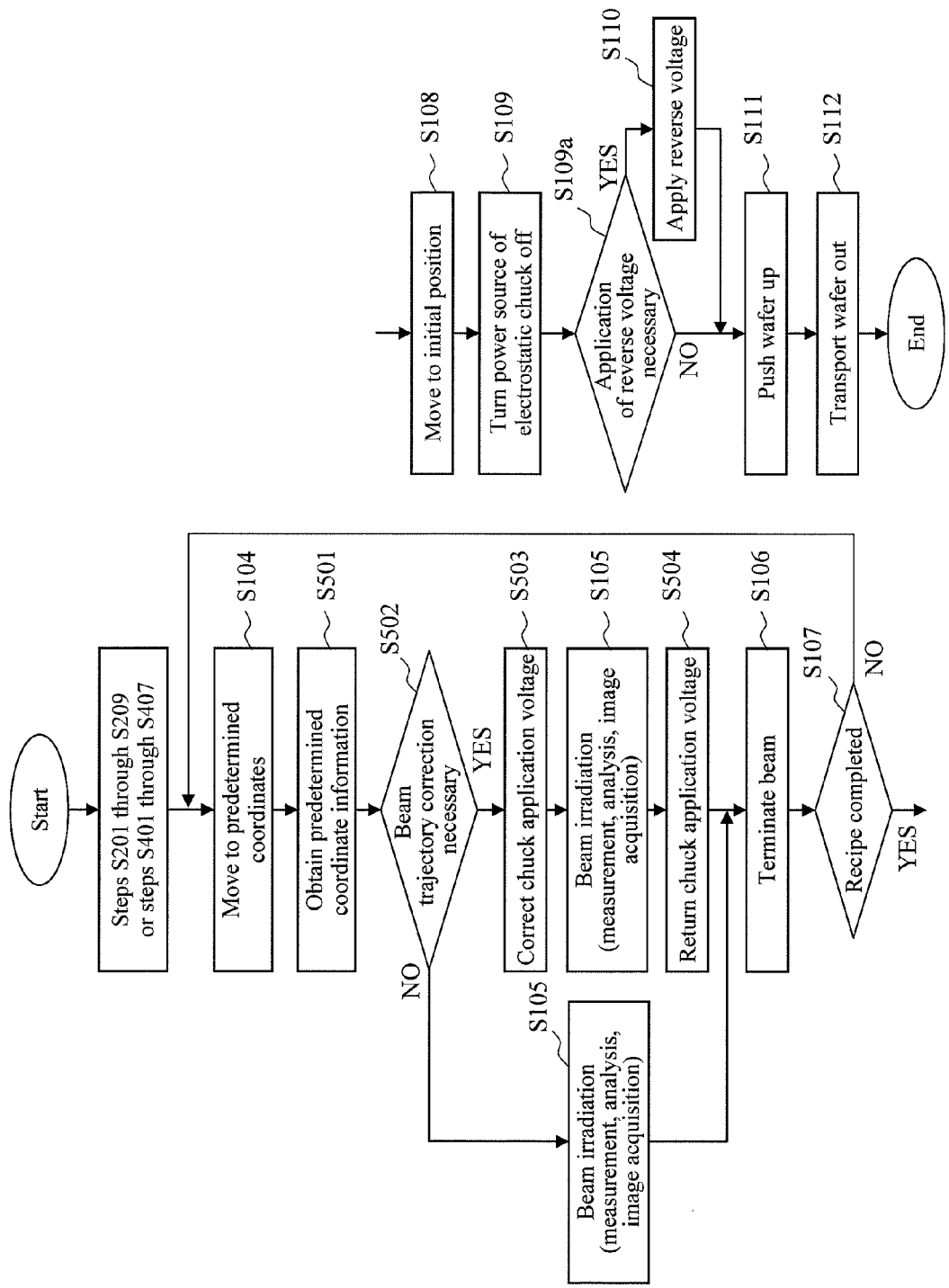
FIG. 12 is a diagram showing the third example of an inspection method using a scanning electron microscope of the present invention.

The third example of a method of inspecting (measuring, analyzing, acquiring an image, etc.) a wafer using a scanning electron microscope of the present invention is described with reference to FIG. 12. First, step S201 through step S209 of the first example of the present invention described with reference to FIG. 7, or step S401 through step S407 of the second example described with reference to FIG. 8, are performed. The wafer is thus attracted to the electrostatic chuck in a flattened state. It is noted that the application voltage for the electrostatic chuck is set to the minimum value required to attract the wafer in a flattened state.

Next, in step S104, the X-Y stage is operated and the wafer is moved to a predetermined coordinate position so as to place the inspection target on the wafer at the electron beam irradiation position. In step S501, coordinate information on the position of the inspection target on the wafer is obtained by the control device. In step S502, it is determined whether the position of the inspection target is near the outer edge of the wafer or not near the outer edge of the wafer. By way of example, if the inspection target lies within a ring-shaped region up to 3 mm inward from the outer edge of the wafer, it may be determined that it is near the outer edge of the wafer. If it lies within a region further inward than that, it may be determined that it is not near the outer edge of the wafer. If the inspection target position is near the outer edge of the wafer, it is determined that it is necessary to suppress the bend in the trajectory of the electron beam 14, and the process proceeds to step S503. If the inspection target position is near the outer edge of the wafer, it is determined that it is unnecessary to suppress the bend in the trajectory of the electron beam 14, and the process proceeds to step S105.

In step S503, the voltage to be applied to the electrostatic chuck is raised to the voltage required to suppress the bend in the trajectory of the electron beam 14, and the process proceeds to step S105. In step S105, wafer inspection (measurement, analysis, image acquisition, etc.) is performed in accordance with recipe conditions. Once inspection (measurement, analysis, image acquisition, etc.) is finished, the voltage to be applied to the electrostatic chuck is returned to the original voltage in step S504. In step S106, beam irradiation is terminated. In step S107, it is determined whether or not a pre-set recipe has been completed. If the recipe has not been completed, step S104 through step S106 are repeated. If the recipe has been completed, the process proceeds to step S108. Step S108 to step S112 are similar to the first example of the present invention described with reference to FIG. 7. In addition, step S109a and step S110 may be omitted.

Although examples of the present invention have been described above, the present invention is by no means limited to the examples discussed above, and it will be readily appreciated by those skilled in the art that various modifications may be made within the scope of the invention as defined by the claims.

LIST OF REFERENCE NUMERALS

1: Electron source
2: Primary electron accelerating electrode
3: High-voltage power source
4: Electron lens
5: Aperture
6: Scanning coil
7: Secondary electron detector
8: Electron objective lens
9: Wafer
10: Electrostatic chuck
11: Y stage
12: X stage
13: Housing
14: Electron beam
15: Secondary electron
16: X-Y stage
18: Processing chamber
24: Main body
25: Ring-shaped internal electrode
26: Circular internal electrode
27: DC power source
28: DC power source
29: Retarding power source
34: Light emitter
35: Light receiver
36: Height measuring device
38: Potential regulating plate
40: Optical axis
42, 43, 44: Potential distribution
60: Load cassette
62: Unload cassette
70: Preparation chamber
71: Transportation mechanism
72: Gate valve
80: Load chamber
81: Transportation mechanism
82: Gate valve
84, 85: Height measuring device

The invention claimed is:

1. A method of setting an application voltage for an electrostatic chuck provided on a sample stage of a scanning electron microscope, the method comprising:
   a testing sample mounting step of mounting on the electrostatic chuck a testing sample whose degree of warp and pattern of warp are known;
   a step of detecting an attraction state of the testing sample with respect to the electrostatic chuck while increasing the application voltage for the electrostatic chuck;
   an application voltage storage step of storing a critical application voltage at which the attraction state of the testing sample changed from "bad" to "good";
   an inspection target sample measuring step of measuring a flatness of an inspection target sample before the inspection target sample is transported into a processing chamber of the scanning electron microscope;
   a step of detecting a degree of warp and pattern of warp of the inspection target sample from the flatness of the inspection target sample;
   an application voltage setting step of setting the application voltage for the electrostatic chuck based on the degree of warp and pattern of warp of the inspection target sample and the critical application voltage stored in the application voltage storage step; and
   an application voltage step in which the inspection target sample is transported into the processing chamber of the scanning electron microscope and mounted on the electrostatic chuck, and in which the application voltage that has been set in the application voltage setting step is applied.

2. The method of setting an application voltage for an electrostatic chuck according to claim 1, wherein
   the application voltage setting step comprises an initial voltage setting step of setting an initial voltage to an application voltage immediately before the attraction state of the testing sample changes from "bad" to "good", and
   the application voltage step comprises:
   a step of applying the initial voltage to the electrostatic chuck;

a step of detecting an attraction state of the inspection target sample with respect to the electrostatic chuck; and an application voltage increasing step of increasing, in predetermined increments, the initial voltage until the attraction state of the inspection target sample changes from "bad" to "good".

3. The method of setting an application voltage for an electrostatic chuck according to claim 2, wherein the predetermined increments in the application voltage increasing step are derived by dividing, into a plurality of equal parts, a unit of increase in the application voltage for the electrostatic chuck in the step of detecting the attraction state of the testing sample.

4. The method of setting an application voltage for an electrostatic chuck according to claim 2, wherein the predetermined increments in the application voltage increasing step are set based on a design tolerance for a thickness of a dielectric film on a surface of the electrostatic chuck.

5. The method of setting an application voltage for an electrostatic chuck according to claim 2, wherein, in the step of detecting the attraction state of the inspection target sample, the flatness of the inspection target sample is measured, and the attraction state of the inspection target sample is detected using the flatness.

6. The method of setting an application voltage for an electrostatic chuck according to claim 2, wherein, in the step of detecting the attraction state of the inspection target sample, the attraction state of the inspection target sample is detected using an optical microscope image or scanning electron microscope image of a surface of the inspection target sample.

7. The method of setting an application voltage for an electrostatic chuck according to claim 2, wherein it is determined that the attraction state of the inspection target sample has changed from "bad" to "good" when the flatness of the inspection target sample comes to fall within a predetermined reference value in the application voltage increasing step.

8. The method of setting an application voltage for an electrostatic chuck according to claim 1, wherein the testing sample mounting step, the step of detecting the attraction state of the testing sample, and the application voltage storage step are executed for each degree of warp and pattern of warp of the testing sample.

9. The method of setting an application voltage for an electrostatic chuck according to claim 1, wherein the inspection target sample measuring step is performed when the inspection target sample is in a load chamber connected to the processing chamber of the scanning electron microscope.

10. The method of setting an application voltage for an electrostatic chuck according to claim 1, wherein
the application voltage setting step comprises an initial voltage setting step of setting an optimal value for the application voltage to an application voltage immediately after the attraction state of the testing sample has changed from "bad" to "good", and
the application voltage step applies the optimal value for the application voltage to the electrostatic chuck.

11. The method of setting an application voltage for an electrostatic chuck according to claim 1, further comprising a measurement target region determination step of determining whether or not a measurement target region is an edge of the inspection target sample, wherein
in the measurement target region determination step, if a measurement point is determined to be an edge of the inspection target sample, the application voltage for the electrostatic chuck is increased to a predetermined value.

12. A scanning electron microscope comprising:
a scanning coil that scans primary electrons from an electron source;
an objective lens that focuses, and irradiates a sample with, the primary electrons;
a secondary electron detector that detects secondary electrons from the sample;
an electrostatic chuck that holds the sample; and
a control device that controls an application voltage for the electrostatic chuck, wherein
on the control device and with respect to a testing sample whose degree of warp and pattern of warp are known, there is stored measurement data representing a relationship between the application voltage for the electrostatic chuck and an attraction state of the testing sample with respect to the electrostatic chuck, and
when an inspection target sample is mounted on the electrostatic chuck, the application voltage for the electrostatic chuck is set based on a degree of warp and pattern of warp of the inspection target sample and the measurement data stored on the control device.

13. The scanning electron microscope according to claim 12, wherein the application voltage for the electrostatic chuck when the inspection target sample is mounted is configured in such a manner that an initial voltage to be applied to the electrostatic chuck is set to an application voltage immediately before the attraction state of the testing sample changes from "bad" to "good" when the application voltage for the electrostatic chuck is increased, and the initial voltage is increased in predetermined increments until an attraction state of the inspection target sample changes from "bad" to "good".

14. The scanning electron microscope according to claim 12, further comprising an attraction state detection device that detects an attraction state of the inspection target sample mounted on the electrostatic chuck.

15. The scanning electron microscope according to claim 14, wherein the attraction state detection device measures the attraction degree by measuring a flatness of the inspection target sample.

16. The scanning electron microscope according to claim 14, wherein the attraction state detection device comprises:
a height measuring device that measures a height of a surface of the inspection target sample; and
an image processing device that measures a flatness of the inspection target sample using an optical microscope image or scanning electron microscope image of the surface of the inspection target sample.

17. The scanning electron microscope according to claim 12, wherein, for the application voltage for the electrostatic chuck when the inspection target sample is mounted, an optimal value for the application voltage is set to an application voltage immediately after the attraction state of the testing sample changes from "bad" to "good" when the application voltage for the electrostatic chuck is increased.

18. A scanning electron microscope comprising:
a scanning coil that scans primary electrons from an electron source;
an objective lens that focuses, and irradiates a sample with, the primary electrons;
a secondary electron detector that detects secondary electrons from the sample;
an electrostatic chuck that holds the sample;

a control device that controls an application voltage for the electrostatic chuck; and an attraction state detection device that detects an attraction state of the sample with respect to the electrostatic chuck, wherein the electrostatic chuck is a bipolar electrostatic chuck comprising a main body, a circular internal electrode disposed within the main body, and a ring-shaped internal electrode disposed around the circular internal electrode, the ring-shaped internal electrode has an outer diameter that is greater than an outer diameter of the sample attracted to the electrostatic chuck, the application voltage for the electrostatic chuck is set to an optimal value capable of supporting the sample in a flat state if a position of a measurement point on an inspection target sample is located further inward than an edge of the sample, and the application voltage for the electrostatic chuck is set to a value greater than the minimum value if the position of the measurement point on the inspection target sample is at the edge of the sample.

19. The scanning electron microscope according to claim 18, wherein on the control device and with respect to a testing sample whose degree of warp and pattern of warp are known, there is stored measurement data representing a relationship between the application voltage for the electrostatic chuck and an attraction state of the testing sample with respect to the electrostatic chuck, and the optimal value for the application voltage is set based on a degree of warp and pattern of warp of the inspection target sample and the measurement data stored on the control device.

20. The scanning electron microscope according to claim 18, wherein the optimal value for the application voltage for the electrostatic chuck is obtained by increasing an initial voltage until the attraction state detected by the attraction state detection device becomes good.

* * * * *